United States Patent
Bitner et al.

(10) Patent No.: US 6,245,144 B1
(45) Date of Patent: Jun. 12, 2001

(54) DOPING CONTROL IN SELECTIVE AREA GROWTH (SAG) OF INP EPITAXY IN THE FABRICATION OF SOLID STATE SEMICONDUCTOR LASERS

(75) Inventors: Thomas C. Bitner; Chris W. Ebert, both of Wymossing; Michael Geva, Allentown, all of PA (US); Charles H. Joyner, Red Bank, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/455,136

(22) Filed: Dec. 6, 1999

(51) Int. Cl.[7] .................................................. C30B 23/00
(52) U.S. Cl. .............................. 117/104; 117/105; 438/45
(58) Field of Search .................................. 117/88, 90, 93, 117/95, 102, 104, 105; 438/45–47, 93, 94, 569

(56) References Cited

U.S. PATENT DOCUMENTS

| | | | |
|---|---|---|---|
| 4,660,208 | 4/1987 | Johnston, Jr. et al. | 372/46 |
| 5,061,643 | 10/1991 | Yagi | 117/90 |
| 5,186,756 | 2/1993 | Benko et al. | 118/730 |
| 5,585,309 | * 12/1996 | Mori et al. | 438/43 |
| 5,723,360 | 3/1998 | Iwasaki | 438/41 |
| 5,728,215 | 3/1998 | Itagaki et al. | 117/104 |
| 6,066,204 | * 5/2000 | Haven | 117/89 |

* cited by examiner

Primary Examiner—Robert Kunemund
Assistant Examiner—Kin-Chan Chen

(57) ABSTRACT

A method of controlling the relative amounts of silicon dopant inside and outside of an enhanced growth region on an indium phosphide substrate using a metalorganic chemical vapor deposition (MOCVD) process. The method includes the steps of positioning the indium phosphide substrate in a reactor chamber, and defining an enhanced growth region on the substrate by depositing a dielectric mask on the substrate. The indium phosphide substrate is heated to a growth temperature of between about 600 and 630° C., and the pressure in the reactor chamber is adjusted to between about 40 and 80 Torr. A first gas contains a metalorganic compound comprising indium and a hydrogen carrier gas flow of between about 12 and 16 liters/minute, and a second gas containing a phosphide and a doping gas containing a silicon dopant at a flow rate of between are introduced into the reactor chamber. The first and second gases are mixed in the chamber and forced over the substrate in a laminar flow such that the mixed convection parameter is between about 0.31 and 0.33. An n-type indium phosphide epitaxial layer is thereby grown over the substrate by reacting the first with the second gas and thermally decomposing the carrier gas, whereby areas inside and outside of the growth enhanced region contain substantially the same amount of silicon dopant.

9 Claims, 2 Drawing Sheets

DOPING CONTROL IN SELECTIVE AREA GROWTH (SAG) OF INP EPITAXY IN THE FABRICATION OF SOLID STATE SEMICONDUCTOR LASERS

BACKGROUND OF THE INVENTION

1. Field of the Invention

The present invention relates to methods of making semiconductor devices and, more particularly, to a method of forming epitaxial layers using a metalorganic chemical vapor deposition (MOCVD) process.

2. Description of the Related Art

One of the most significant developments in semiconductor technology in recent years has been the increased use of III–V materials such as gallium arsenide and indium phosphide, and their ternary and quaternary alloys such as indium-gallium-arsenide-phosphide, as the active materials of semiconductor devices. The band gap characteristics of such materials typically make them candidates for optoelectronic and photonic applications such as lasers, light emitting diodes and photodetectors. For integrated circuit use, their high electron mobility often makes them preferable to the more commonly used semiconductor, silicon. Fabrication of such devices generally requires epitaxal growth of one or more layers on a single-crystal substrate. Epitaxial growth refers to a method of depositing a material on a substrate such that the crystal structure of the deposited material effectively constitutes an extension of the crystal structure of the substrate.

The three broad classes of methods for deposition by epitaxial growth are liquid phase epitaxy, vapor phase epitaxy and molecular beam epitaxy which respectively involve deposition from a liquid source, a vapor source and a molecular beam. A particularly promising form of vapor phase epitaxy is a method for deposition from a gas including a metalorganic compound; this process, known as metalorganic chemical vapor deposition (MOCVD), is described in a number of scientific publications including, "Metalorganic Chemical Vapor Deposition of III–V Semiconductor," M. J. Ludowise, Journal of Applied Physics, Vol. 58, No. 8, Oct. 15, 1985, pp. R31–R55, and the paper, "Metalorganic Chemical Vapor Deposition," P. Daniel Dapkus, American Review of Material Sciences, Annual Reviews, Inc., 1982, pp. 243–268, both of which are expressly incorporated by reference herein. MOCVD processes make use of a reactor in which a heated substrate is exposed to a gaseous metalorganic compound containing one element of the epitaxial layer to be grown and a gaseous second compound containing another element of the desired epitaxial material. For example, to grow the III–V material gallium arsenide, one may use the metalorganic gas triethylgallium [$(C_2H_5)_3Ga$] as the gallium source and arsine ($AsH_3$) as the source of the group V component, arsenic. The gas mixture is typically injected axially at the top of a vertically extending reactor in which the substrate is mounted on a susceptor that is heated by a radio-frequency coil. The gases are exhausted from a tube at the end of the reactor opposite the input end.

Recently, the use of selective area growth (SAG) in the manufacture of optoelectronic components has increased chip functionality by increasing the integration of more components on a single device (e.g. beam expanded laser, electromodulated lasers). Silane ($SiH_4$) is a typical n-type precursor gas used in low pressure metalorganic chemical vapor deposition (LPMOCVD) technology. With the use of silane, the silicon dopant concentration in the SAG area is always less than the adjacent field area (i.e., the region outside the SAG area). This relative difference in dopant concentration is often referred to as the silicon reduction ratio (SRR). In order to optimize device performance, it is desirable to maintain substantially the same silicon dopant levels in and out of the SAG areas, i.e., a silicon reduction ratio of 1.

Accordingly, there is a need for a low-cost technique to adjust the silicon reduction ratio in the MOCVD process.

SUMMARY OF THE INVENTION

An object of the present invention is to provide a method to vary the ratio of silicon dopant in a SAG area and an adjacent maskless area so as to optimize the performance of integrated optoelectonic devices.

According to an aspect of the invention, the ratio of silicon in a masked area to an unmasked area can be modulated between about 0.6 and 1.3 by varying the growth conditions inside a MOCVD reactor chamber.

Advantageously, the present invention employs growth conditions in the reactor such that the silicon reduction ratio is approximately 1.

In one embodiment, the invention provides a method of controlling the relative amounts of silicon dopant inside and outside of enhanced growth regions on an indium phosphide substrate using a metalorganic chemical vapor deposition (MOCVD) process. The inventive method includes the steps of positioning the indium phosphide substrate in a reactor chamber, and defining an enhanced growth region on the substrate by depositing a dielectric mask on the substrate. The indium phosphide substrate is heated to a growth temperature of between about 600 and 630° C. The pressure in the reactor chamber is adjusted to between about 40 and 80 Torr. A first gas containing a metalorganic compound comprising indium and a hydrogen carrier gas, and a second gas containing a hydride (e.g., phosphide) and a doping gas containing $SiH_4$ are introduced into the reactor chamber. The first gas and the second gas are mixed and forced over the substrate in a laminar flow such that the mixed convection parameter is between about 0.31 and 0.33. An n-type indium phosphide epitaxial layer is thereby grown over the substrate by reacting the first gas with the second gas and thermally decomposing the doping gas, whereby areas inside and outside of the growth enhanced region contain substantially the same amount of silicon dopant.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE CURRENTLY PREFERRED EMBODIMENTS

Figure 1:
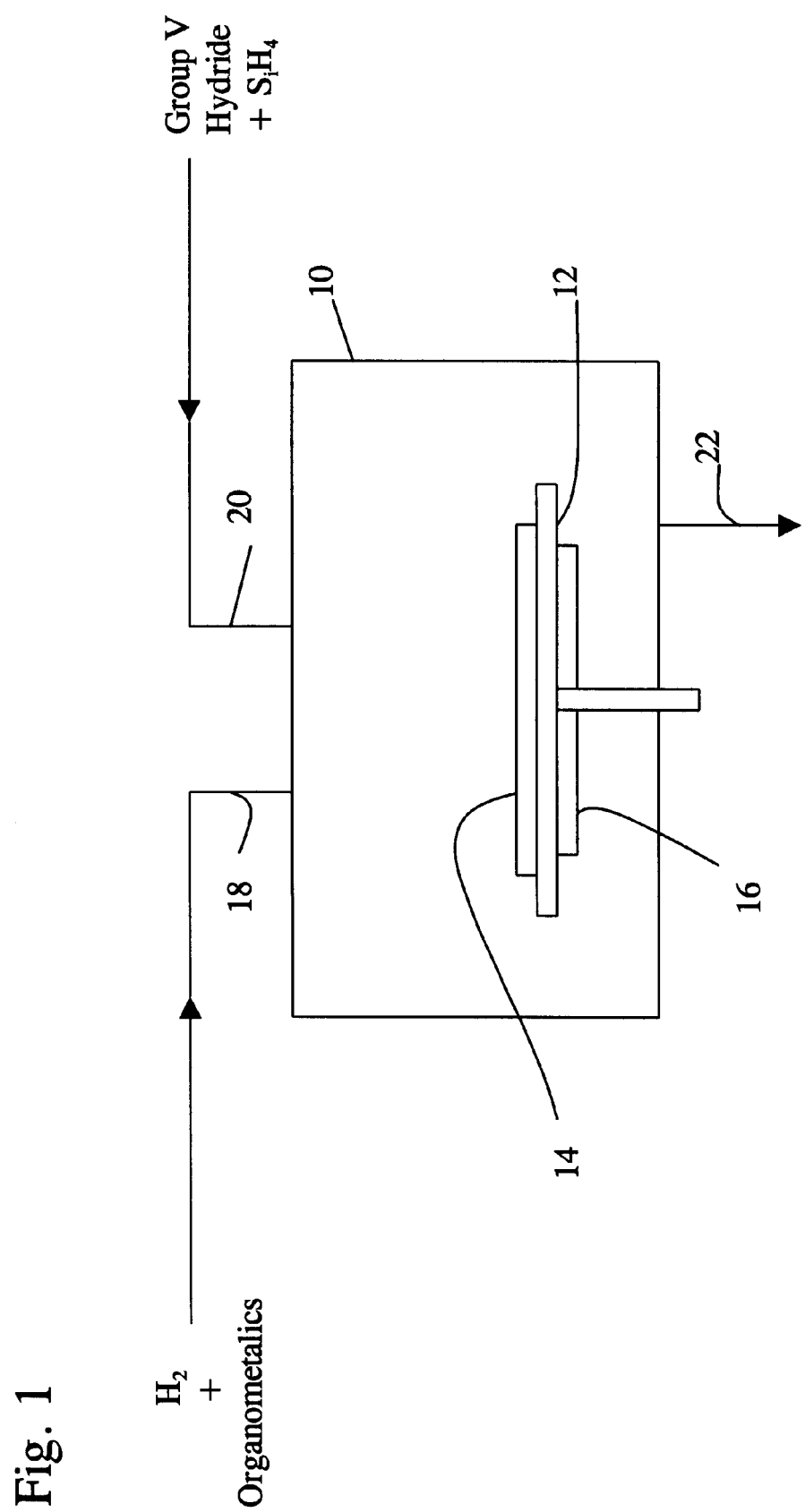
FIG. 1 diagrammatically depicts an MOCVD apparatus.

Referring now to the drawings, FIG. 1 depicts an apparatus for growing epitaxial layers using MOCVD in accordance with a preferred embodiment of the present invention. The apparatus includes a reactor chamber 10, a rotatable susceptor 12 for rotatively supporting a substrate 14 (e.g. a monocrystalline InP substrate) inside the reactor chamber 10, and a stationary resistive heater 16 adjacent the rotatable susceptor 12 for heating the substrate 14. The apparatus further includes a first inlet 18 for feeding a gas containing a Group III metalorganic compound and a carrier gas (e.g. $H_2$) and a second inlet 20 for feeding a gas containing a Group V hydride gas and a doping gas containing, for example, silane ($SiH_4$) into the chamber 10. Exhaust gas is vented out of the reactor chamber through an outlet 22.

In the preferred embodiment, the substrate 14 is formed of monocrystalline InP, which should be of high purity and essentially free of crystalline dislocations. To form an epitaxial layer on substrate 14, a metalorganic compound such, for example, as trimethylindium [$(CH_3)_3In$] is employed as a source of indium, and the hydride gas may for example be phosphine ($PH_3$). These two gases are mixed and forced to flow over the heated substrate 14 in a laminar flow. The two gases react with each other and form the desired epitaxial layer of indium phosphide on the InP substrate 14. An n-type dopant may be incorporated into the epitaxial layer by introducing a doping gas containing, for example, silane ($SiH_4$) gas into the reactor chamber and thermally decomposing the doping gas while the epitaxial layer is being grown. The remaining portion of the gases, including byproducts of the reaction, is exhausted through the outlet 22.

To fabricate, for example, an optical waveguide device such as a semiconductor laser with an optical waveguide modulator on the substrate 14, the Selective Area Growth (SAG) technique is used to form a lower cladding layer, a multiple-quantum well structure (MQS) waveguide layer, an upper cladding layer, and a contact layer of the laser. The SAG technique utilizes the phenomenon that growth rate increases at an edge and a peripheral portion of a dielectric mask (e.g., $SiO_2$), because growth species recoiling the mask diffuse in the vapor phase or on the mask surface toward the peripheral portion of the mask. Accordingly, the difference in growth rate between the peripheral portion and the gap region (i.e., the SAG area) defined by the mask and regions outside of the SAG area (i.e., the field area) enables the mask to control the distribution of the thickness of a layer grown on the substrate.

Figure 2:
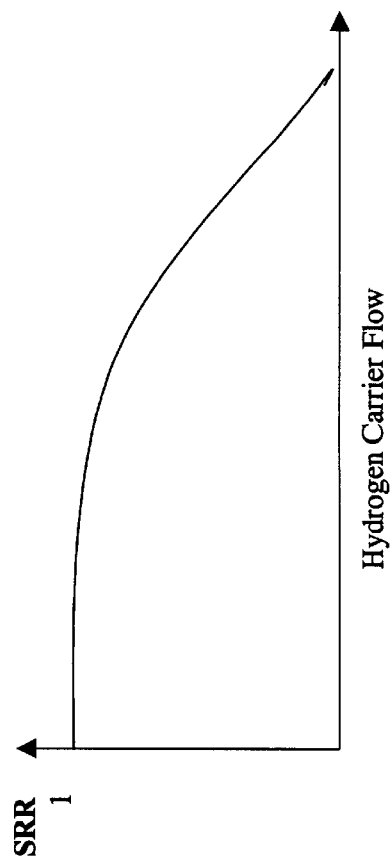
FIG. 2 graphically illustrates the effect of hydrogen flow rate on SRR.

It has been discovered that the silicon reduction ratio, i.e. the difference in the amount of silicon dopant absorbed in and out of the SAG areas, can be controlled by adjusting the growth conditions in the reactor chamber 10. Advantageously, the silicon reduction ratio can be adjusted between about 0.65 to 1.0 by using the following inventive growth conditions:

| | |
|---|---|
| Growth Pressure: | about 40–80 Torr |
| Growth Temperature: | about 600 to 630° C. |
| Hydrogen Carrier Flow: | about 12 to 16 liters/minute |
| Reynolds Number: | laminar flow (e.g. about 438) |
| Mixed Convection Parameter: | about 0.31 to 0.33 | where growth pressure is the pressure inside the reactor chamber 10; growth temperature is the temperature of the heated substrate 14; hydrogen carrier flow is the flow rate of the hydrogen gas; Reynolds number is a dimensionless parameter indicating the type of flow regime (e.g. laminar, transition, or turbulent); and the mixed convection parameter (MCP) is a dimensionless parameter indicating the degree of mixture of the gases and is defined by:

$$MCP = g(T_d/T_\infty - 1)/\omega(\omega v_\infty)^{1/2}$$

where g=gravitational constant
$T_d$=Temperature of disk (assumed to be wafer temperature)
$T_\infty$=Temperature of gas at an infinite radius
$\omega$=angular velocity
$v_\infty$=kinematic viscosity FIG. 2 graphically illustrates the effect of the hydrogen carrier flow on the silicon reduction ratio at a growth temperature of about 620° C. and a pressure of about 60 Torr in accordance with an embodiment of the present invention. In this embodiment, adjusting the hydrogen carrier flow to between about 12 to 16 liter/minute increases the SRR to about 0.86.

Figure 3:
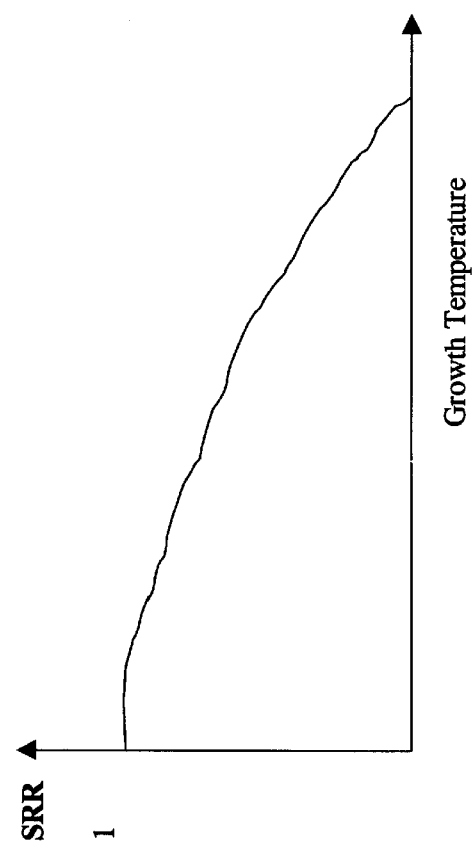
FIG. 3 graphically illustrates the effect of growth temperature on SRR.

FIG. 3 graphically depicts the effect of growth temperature on the SRR at a hydrogen carrier flow rate of about 16 liters/minute and a pressure of about 60 Torr in accordance with another embodiment of the invention. In this further embodiment, adjusting the growth temperature to between about 600 and 630° C. increases the SRR to about 0.95.

Thus, while there have shown and described and pointed out fundamental novel features of the invention as applied to preferred embodiments thereof, it will be understood that various omissions and substitutions and changes in the form and details of the methods described and devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A method of controlling relative amounts of silicon dopant inside and outside of enhanced growth regions on an indium phosphide substrate using a metalorganic chemical vapor deposition (MOCVD) process, comprising the steps of:

(a) positioning the indium phosphide substrate in a reactor chamber;

(b) defining an enhanced growth region on the substrate by depositing a dielectric mask on the substrate;

(c) introducing, into the reactor chamber, a first gas containing a metalorganic compound comprising indium and a hydrogen carrier gas at a first flow rate, and a second gas containing a phosphide and a doping gas containing a silicon dopant at a second flow rate;

(d) mixing the introduced first gas with the introduced second gas and forcing the mixed gases over the substrate in a laminar flow with a mixed convection parameter of between about 0.31 and 0.33;

(e) growing an n-type indium phosphide epitaxial layer inside and outside of the enhanced growth region on the substrate in the reactor chamber by reacting the first gas with the second gas and thermally decomposing the doping gas; and (f) controlling a silicon reduction ratio of the n-type indium phosphide epitaxial layer in the areas on the substrate inside and outside of the enhanced growth region by adjusting at least one of a temperature of the indium phosphide substrate and the first and second flow rates during said step (e).

2. The method of claim 1, wherein said step (f) comprises adjusting at least one of a temperature of the indium phosphide substrate and the first and second flow rates for producing a silicon reduction ratio within a range including about 0.8 to 1.0.

3. The method of claim 1, wherein the doping gas introduced in said step (c) includes silane.

4. The method of claim 3, wherein the metalorganic compound of the first gas introduced in said step (c) is trimethylindium (($CH_3$)$_3$In).

5. The method of claim 4 wherein the second gas introduced in said step (c) includes phosphine ($PH_3$).

6. The method of claim 1, further comprising the step of adjusting the pressure in the reactor chamber within a range including 40 to 80 Torr.

7. The method of claim 1, wherein said step (f) comprises adjusting the growth temperature of the indium phosphide substrate within a range including 600 to 630° C.

8. The method of claim 1, wherein said step (f) comprises adjusting the first and second flow rates so that the rates of the first and second flow rates are within a range including 12 to 16 liters/minute.

9. The method of claim 8, wherein said step (f) further comprises adjusting the growth temperature of the indium phosphide substrate within a range including 600 to 630° C.

* * * * *